(12) United States Patent
Liao et al.

(10) Patent No.: US 11,195,812 B2
(45) Date of Patent: Dec. 7, 2021

(54) METHOD FOR FABRICATING AN ENCAPSULATED ELECTRONIC PACKAGE USING A SUPPORTING PLATE

(71) Applicant: SILICONWARE PRECISION INDUSTRIES CO., LTD., Taichung (TW)

(72) Inventors: Hsin-Yi Liao, Taichung (TW); Cheng-Kai Chang, Taichung (TW); Bo-Hao Ma, Taichung (TW); Chun-Chi Ke, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

(21) Appl. No.: 16/821,095

(22) Filed: Mar. 17, 2020

(65) Prior Publication Data

US 2021/0175196 A1 Jun. 10, 2021

(30) Foreign Application Priority Data

Dec. 6, 2019 (TW) .................................. 108144709

(51) Int. Cl.
*H01L 23/00* (2006.01)
(52) U.S. Cl.
CPC .............. *H01L 24/26* (2013.01); *H01L 24/48* (2013.01); *H01L 2224/73265* (2013.01)
(58) Field of Classification Search
CPC ...................................................... H01L 24/26
USPC ........................................................... 438/455
See application file for complete search history.

(56) References Cited

U.S. PATENT DOCUMENTS

| 2012/0013006 A1* | 1/2012 | Chang | H01L 21/561 257/738 |
| 2012/0244664 A1* | 9/2012 | Jin | H01L 23/5389 438/118 |
| 2013/0228915 A1* | 9/2013 | Chang | H01L 21/78 257/734 |
| 2014/0175665 A1* | 6/2014 | Kang | H01L 25/0655 257/774 |
| 2015/0021754 A1* | 1/2015 | Lin | H01L 23/5389 257/712 |
| 2019/0244907 A1* | 8/2019 | Liao | H01L 24/19 |

FOREIGN PATENT DOCUMENTS

WO    WO-2011112301 A2 *   9/2011    ............. H01L 21/78

* cited by examiner

*Primary Examiner* — Ajay Arora
(74) *Attorney, Agent, or Firm* — Kelly & Kelley, LLP

(57) ABSTRACT

A method for fabricating an electronic package is provided. A plurality of packaging structures are provided, each of which having a carrier and at least one electronic component disposed on the carrier. The plurality of packaging structures are disposed on a supporting plate. An encapsulation layer is formed on the supporting plate and encapsulates the plurality of packaging structures. Even if there are various types of electronic packages of different specifications in the market, the molds that the encapsulation layer uses can still be developed for a supporting plate of a certain specification. Therefore, the fabrication cost of the electronic package is reduced.

10 Claims, 4 Drawing Sheets

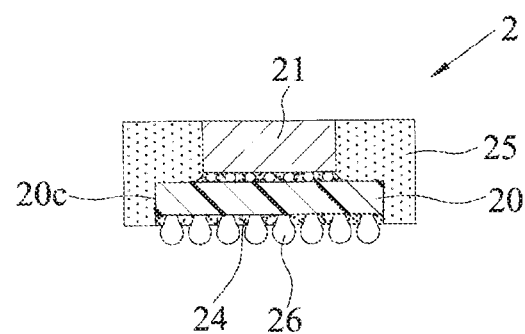
FIG. 2F
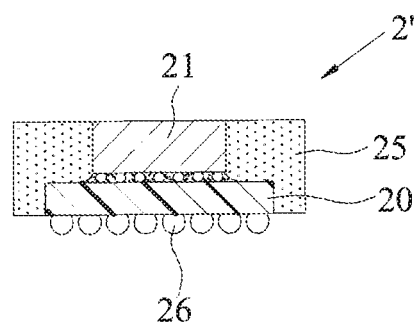
FIG. 2F'
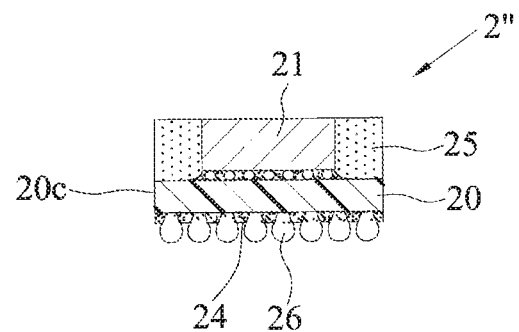
FIG. 2F"

METHOD FOR FABRICATING AN ENCAPSULATED ELECTRONIC PACKAGE USING A SUPPORTING PLATE

CROSS-REFERENCE TO RELATED APPLICATIONS

This application claims priority to Taiwanese Application Serial No. 108144709, filed on Dec. 6, 2019. The entirety of the application is hereby incorporated by reference herein and made a part of this specification.

BACKGROUND

1. Technical Field

The present disclosure relates to semiconductor packaging processes, and, more particularly, to a method for fabricating an electronic package.

2. Description of the Prior Art

With the rapid development of electronic industry, advanced electronic products are developed to become compact-sized and low-profiled. As packaging techniques evolve, chips can be packaged in various manners, and a semiconductor package is becoming smaller and lighter.

FIG. 1 is a cross-sectional view of a semiconductor package 1 according to the prior art. As shown in FIG. 1, the semiconductor package 1 comprises a packaging substrate 10, a semiconductor chip 11 disposed on the packaging substrate 10 in a flip-chip manner, and a packaging resin 13 that encapsulates the semiconductor chip 11. A plurality of conductive pads 100 are disposed on a chip mounting side of the packaging substrate 10. A plurality of solder balls 14 are bonded to a ball planting side of the packaging substrate 10, for a circuit board to be mounted thereon. The semiconductor chip 11 has electrode pads 110 that are bonded via a plurality of solder bumps 12 to the conductive pads 100.

In a packaging process of the semiconductor package 1, a plurality of semiconductor chips 11 are disposed on a packaging substrate 10 in a panel form, a packaging resin 13 is then formed, and a singulation process is performed, to obtain a plurality of the semiconductor packages 1.

However, the semiconductor package 1 can be fabricated in compliance with a certain one of a variety of specifications. Accordingly, a mold that forms the packaging resin 13 has to be in compliance with the certain specification of the semiconductor package 1 and be developed to have a certain shape. As such, the fabrication cost is greatly increased.

Therefore, how to overcome the drawbacks of the prior art is becoming an urgent issue in the art.

SUMMARY

In view of the drawbacks of the prior art, the present disclosure provides a method for fabricating an electronic package, comprising: providing a plurality of packaging structures, each of which comprising: a carrier having a first surface and a second surface opposing the first surface; and at least one electronic component disposed on the first surface of the carrier and electrically connected to the carrier; placing the plurality of packaging structures on a supporting plate, with the second surfaces of any two neighboring ones of the carriers facing to and spaced apart from each other; forming on the supporting plate an encapsulation layer that encapsulates the plurality of packaging structures; and removing the supporting plate.

In an embodiment, the second surface of the carrier is bonded to the supporting plate via a bonding layer.

In an embodiment, the supporting plate is an adhesive tape or a metal plate.

In an embodiment, the supporting plate is rectangular or circular.

In an embodiment, a stiffener is disposed on an edge of the supporting plate.

In an embodiment, the electronic component is exposed from the encapsulation layer.

In an embodiment, the method further comprises disposing a plurality of conductive elements on the second surface of the carrier.

In an embodiment, the method further comprises performing a singulation process after the supporting plate is removed. In another embodiment, the encapsulation layer encapsulates a lateral surface of the carrier after the singulation process is performed. In yet another embodiment, the encapsulation layer does not encapsulate a lateral surface of the carrier after the singulation process is performed.

It is known from the above that in the method for fabricating an electronic package according to the present disclosure, a plurality of packaging structures are fabricated and disposed on a supporting plate, and then an encapsulation layer is formed, followed by a singulation process. Therefore, a mold that forms the encapsulation layer is developed based on the specification of the supporting plate, without taking the specification of the electronic package into consideration, i.e., having one single specification. Even if there are various types of electronic packages of different specifications in the market, the mold that forms the encapsulation layer can be developed based on the specification of the supporting plate, i.e., with one single specification. Compared with the prior art, the electronic package fabricated by the method according to the present disclosure has a reduced cost.

BRIEF DESCRIPTION OF THE DRAWINGS

FIGS. 2A to 2F are cross-sectional views illustrating a method for fabricating an electronic package according to the present disclosure.

FIG. 2D' is a cross-sectional view of another embodiment of FIG. 2D.

FIGS. 2F' and 2F" are cross-sectional views of different embodiments of FIG. 2F.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

FIGS. 2A to 2F are cross-sectional views illustrating a method for fabricating an electronic package 2 according to the present disclosure.

Figure 1:
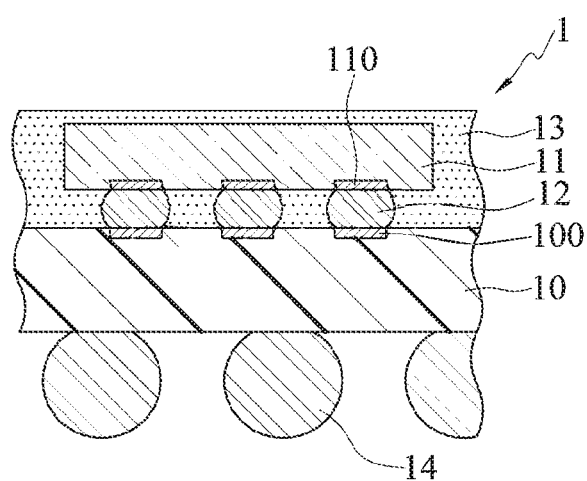
FIG. 1 is a cross-sectional view of a semiconductor package according to prior art.
Figure 2A:
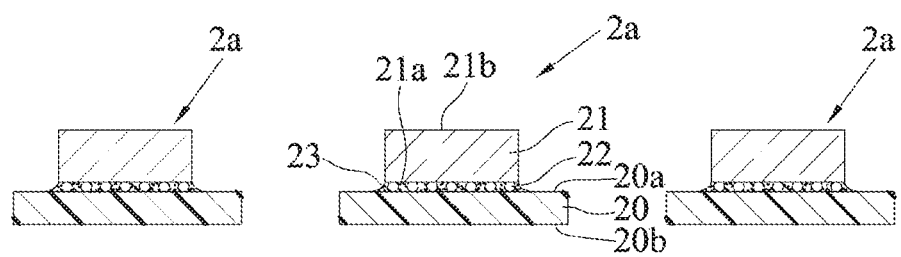

As shown in FIG. 2A, a plurality of packaging structures 2a are provided. Each of the packaging structures 2a has a carrier 20 and at least one electronic component 21. The carrier 20 has a first surface 20a and a second surface 20b opposing the first surface 20a. The electronic component 21 is disposed on the first surface 20a of the carrier 20 and electrically connected to the carrier 20.

In an embodiment, the carrier 20 is a packaging substrate that has a core layer and a circuit structure, or a coreless circuit structure. For the circuit structure, a circuit layer (not shown), such as a fan out redistribution layer (RDL), is formed on a dielectric material. In an embodiment, the dielectric material is polybenzoxazole (PBO), polyimide (PI), prepreg (PP), etc. In another embodiment, the carrier 20 is a carrying unit, such as a lead-frame, a silicon interposer, etc., that carries an electronic component, such as a chip.

In an embodiment, the electronic component 21 is an active element, such as a semiconductor chip, a passive element, such as a resistor, a capacitor and an inductor, or a combination thereof. In another embodiment, the electronic component 21 is a semiconductor chip and has an active surface 21a and an inactive surface 21b opposing the active surface 21a, a plurality of electrode pads (not shown) are disposed on the active surface 21a and electrically connected via the plurality of conductive bumps 22 in a flip-chip manner to a wiring layer of the carrier 20, and an underfill 23 encapsulates the conductive bumps 22. In yet another embodiment, the inactive surface 21b of the electronic component 21 is disposed on the first surface 20a of the carrier 20, and the electrode pads are electrically connected to the wiring layer in a wire bonding manner via a plurality of solder wires (not shown). In still another embodiment, the electronic component 21 is in direct contact with (e.g., electrode pads of a chip bonded to contact pads of a substrate) and electrically connected to the wiring layer. In further another embodiment, the electronic component 21 is electrically connected to the carrier 20 in other manners.

Figure 2B:
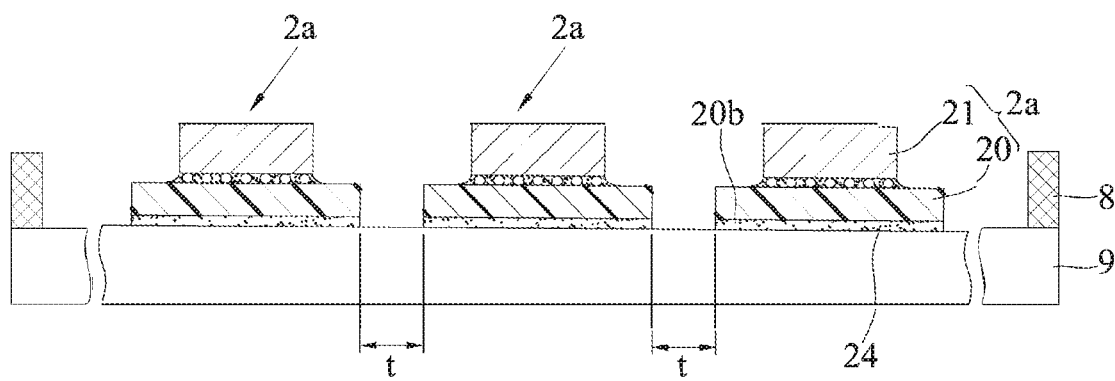

As shown in FIG. 2B, the second surfaces 20b of the carriers 20 of the plurality of packaging structures 2a are disposed on the supporting plate 9, and any two neighboring ones of the plurality of packaging structures 2a are spaced apart at an interval t on the supporting plate 9.

In an embodiment, the second surface 20b of the carrier 20 is bonded via a bonding layer 24 to the supporting plate 9. In another embodiment, the bonding layer 24 is adhesive, such as an adhesive tape or a release film.

In an embodiment, the supporting plate 9 is an adhesive tape or a metal plate. In another embodiment, the supporting plate 9 is in a panel form or a strip form. In yet another embodiment, the supporting plate 9 is rectangular or circular.

In an embodiment, a stiffener 8 is disposed on an edge of the supporting plate 9. In another embodiment, the stiffener 8 is a metal frame, a wall or a pillar.

Figure 2C:
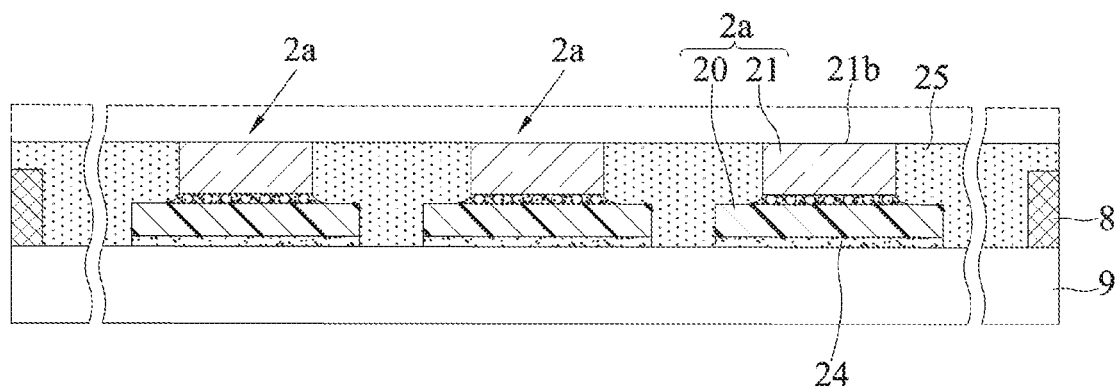

As shown in FIG. 2C, an encapsulation layer 25 is formed on the supporting plate 9 and encapsulates the packaging structures 2a.

In an embodiment, the encapsulation layer 25 is a molding underfill (MUF), and is made of polyimide (PI), a dry film, epoxy or a molding compound. In another embodiment, the encapsulation layer 25 is formed by a liquid compound, injection, lamination or compression molding on the supporting plate 9.

In an embodiment, the electronic component 21 is exposed from the encapsulation layer 25. In another embodiment, an upper surface of the encapsulation layer 25 is flush with the inactive surface 21b of the electronic component in a leveling process, and the inactive surface 21b of the electronic component is exposed from the encapsulation layer 25. In yet another embodiment, the leveling process removes a portion of the encapsulation layer 25 (as indicated by a dashed line in FIG. 2C) by grinding.

Figure 2D:
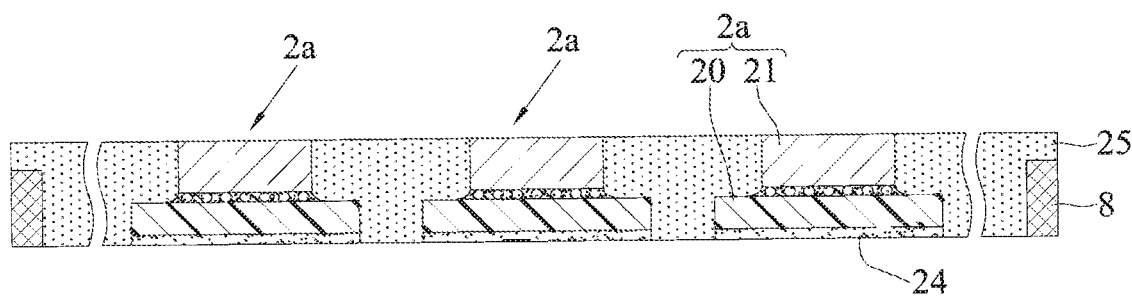
Figure 2D:
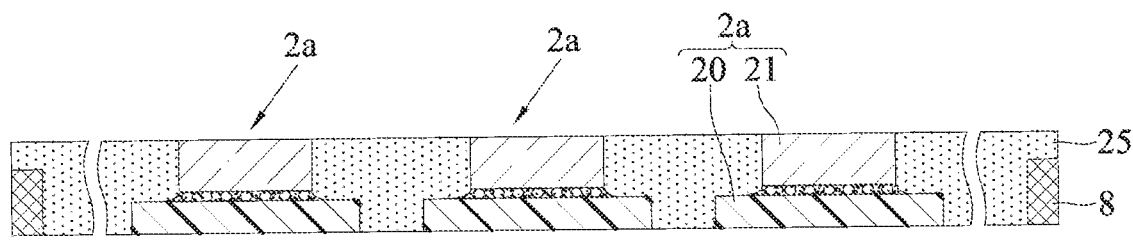

As shown in FIG. 2D, the supporting plate 9 is removed, to expose a lower surface of the encapsulation layer 25 and a lower surface of the bonding layer 24 (or a bottom surface of the stiffener 8).

In another embodiment, as shown in FIG. 2D', the bonding layer 24 is removed so as to expose the second surface 20b of the carrier 20.

Figure 2E:
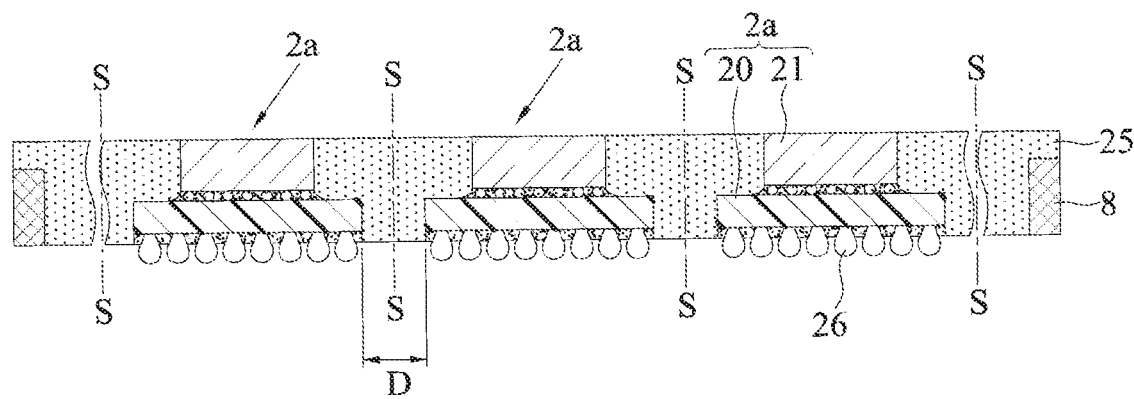

As shown in FIG. 2E, following the fabrication step of FIG. 2D, a plurality of conductive elements 26 are formed on the second surface 20b of the carrier 20 and electrically connected to the wiring layer of the carrier 20.

In an embodiment, the conductive elements 26 pass through the bonding layer 24 and electrically connected to the wiring layer of the carrier 20. In another embodiment, the conductive elements 26 are in the shape of a ball, such as a solder ball, are metal pillars, such as copper pillars or solder bumps, or are stud conductive elements fabricated by a wire bonder.

As shown in FIG. 2F, a singulation process is performed along a cutting path S shown in FIG. 2E to obtain a plurality of electronic packages 2. In an embodiment, an electronic device (not shown), such as a circuit board, is disposed on the electronic package 2 via the conductive elements 26.

In an embodiment, the encapsulation layer 25 encapsulates a lateral surface 20c of the carrier 20 after the singulation process is performed.

Following the fabrication process of FIG. 2 D', an electronic package 2' shown in FIG. 2F' is obtained, in which the conductive elements 26 are bonded to the second surface 20b of the carrier 20 and electrically connected to the wiring layer of the carrier 20.

In an embodiment, the encapsulation layer 25 does not encapsulate the carrier 20, like the electronic package 2" shown in FIG. 2F". In another embodiment, a width D of the cutting path S is adjusted (as shown in FIG. 2E), a lateral surface of the encapsulation layer 25 is flush with the lateral surface 20c of the carrier 20, and the lateral surface 20c of the carrier 20 is exposed from the encapsulation layer 25.

In the method for fabricating the electronic package according to the present disclosure, the plurality of packaging structures 2a are fabricated and disposed on the supporting plate 9, then the encapsulation layer 25 is formed, and a singulation process is performed. Therefore, a mold that forms the encapsulation layer 25 is developed based on the specification of the supporting plate 9, and the fabrication cost is greatly reduced.

According to the method for fabricating the electronic packages 2, 2' and 2" of the present disclosure, through the design of the plurality of packaging structures 2a even if the electronic packages 2, 2' and 2" have different specifications, a mold that forms the encapsulation layer 25 can still be developed based on the specification of the supporting plate 9, without taking the specification of the electronic packages 2, 2' and 2" into consideration, and has a single specification. Compared with the prior art, the electronic package fabricated by the method according to the present disclosure has a reduced cost.

The foregoing descriptions of the detailed embodiments are only illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A method for fabricating an electronic package, comprising:
   providing a plurality of packaging structures, each of which comprising:
      a carrier including a wiring layer and having a first surface and a second surface opposing the first surface; and
      at least one electronic component disposed on the first surface of the carrier and electrically connected to the wiring layer;
   placing the plurality of packaging structures on a supporting plate, with the second surfaces of any two neighboring ones of the carriers facing the supporting plate and spaced apart from each other on the supported plate;
   forming on the supporting plate an encapsulation layer encapsulating the plurality of packaging structures; and
   removing the supporting plate.

2. The method of claim 1, wherein the second surface of the carrier is bonded to the supporting plate via a bonding layer.

3. The method of claim 1, wherein the supporting plate is an adhesive tape or a metal plate.

4. The method of claim 1, wherein the supporting plate is rectangular or circular.

5. The method of claim 1, further comprising disposing a stiffener on an edge of the supporting plate.

6. The method of claim 1, wherein the electronic component is exposed from the encapsulation layer.

7. The method of claim 1, further comprising disposing a plurality of conductive elements on the second surface of the carrier.

8. The method of claim 1, further comprising performing a singulation process after removing the supporting plate.

9. The method of claim 8, wherein the encapsulation layer encapsulates a side surface of the carrier after performing the singulation process, and the side surface is adjacent to the first surface and the second surface of the carrier.

10. The method of claim 8, wherein the encapsulation layer does not encapsulate a side surface of the carrier after performing the singulation process, and the side surface is adjacent to the first surface and the second surface of the carrier.

* * * * *